United States Patent
Kawanishi

(10) Patent No.: US 9,705,287 B2
(45) Date of Patent: Jul. 11, 2017

(54) METHOD OF FABRICATING A P TYPE NITRIDE SEMICONDUCTOR LAYER DOPED WITH CARBON

(71) Applicant: Seoul Semiconductor Co., Ltd., Seoul (KR)

(72) Inventor: Hideo Kawanishi, Tokyo (JP)

(73) Assignee: Seoul Semiconductor Co., Ltd., Ansan-si (KR)

(*) Notice: Subject to any disclaimer, the term of this patent is extended or adjusted under 35 U.S.C. 154(b) by 224 days.

(21) Appl. No.: 14/180,446

(22) Filed: Feb. 14, 2014

(65) Prior Publication Data

US 2014/0225153 A1    Aug. 14, 2014

(30) Foreign Application Priority Data

Feb. 14, 2013 (JP) .................. 2013-027026
Jan. 10, 2014 (JP) .................. 2014-003759

(51) Int. Cl.
*H01L 33/00* (2010.01)
*H01L 21/00* (2006.01)
(Continued)

(52) U.S. Cl.
CPC ........ *H01S 5/3013* (2013.01); *H01L 21/0237* (2013.01); *H01L 21/0254* (2013.01);
(Continued)

(58) Field of Classification Search
CPC .......... H01L 21/02631; H01L 21/0254; H01L 21/02241; H01L 21/02458;
(Continued)

(56) References Cited

U.S. PATENT DOCUMENTS 5,679,965 A   10/1997   Schetzina
8,940,624 B2*   1/2015   Kawanishi .......... H01L 21/0242
                                               438/40
(Continued)

FOREIGN PATENT DOCUMENTS

JP   H08-008182   1/1996
JP   H08-288577   11/1996
(Continued)

OTHER PUBLICATIONS

Notice of Allowability issued Mar. 20, 2014 in U.S. Appl. No. 13/865,574.
(Continued)

*Primary Examiner* — Alonzo Chambliss
(74) *Attorney, Agent, or Firm* — H.C. Park & Associates, PLC

(57) ABSTRACT

A method of stably manufacturing a p type nitride semiconductor layer using a carbon dopant is provided. A crystal plane substrate is prepared having a main surface which has an offset angle in a range of +/−0.1% with respect to a C-plane or a crystal plane equivalent to the C-plane; and during a time period in which a III-source gas and a V-source gas are supplied to grow a III-V group nitride semiconductor layer, carbon tetrabromide ($CBr_4$), which is a carbon source gas, is supplied so as to introduce carbon into a V-group atom layer.

10 Claims, 12 Drawing Sheets

(51) Int. Cl.
*H01S 5/30* (2006.01)
*H01L 21/02* (2006.01)
*H01L 33/32* (2010.01)
*H01S 5/042* (2006.01)
*H01S 5/323* (2006.01)
*H01S 5/32* (2006.01)

(52) U.S. Cl.
CPC .... *H01L 21/0262* (2013.01); *H01L 21/02389* (2013.01); *H01L 21/02433* (2013.01); *H01L 21/02458* (2013.01); *H01L 21/02579* (2013.01); *H01L 33/0062* (2013.01); *H01L 33/32* (2013.01); *H01L 33/325* (2013.01); *H01S 5/0421* (2013.01); *H01S 5/3054* (2013.01); *H01S 5/32341* (2013.01); *H01S 5/3202* (2013.01)

(58) Field of Classification Search
CPC ......... H01L 21/02579; H01L 21/02389; H01L 21/02381; H01L 21/02378; H01L 21/02505
See application file for complete search history.

(56) References Cited

U.S. PATENT DOCUMENTS

| | | | |
|---|---|---|---|
| 9,233,844 B2 * | 1/2016 | Chen | B82Y 10/00 |
| 2002/0017696 A1 * | 2/2002 | Nakayama | H01L 21/28587 257/471 |
| 2008/0199649 A1 * | 8/2008 | Xu | C30B 25/18 428/80 |
| 2011/0147759 A1 * | 6/2011 | Oshima | B82Y 20/00 257/76 |

FOREIGN PATENT DOCUMENTS

| | | |
|---|---|---|
| JP | 2001-274457 | 10/2001 |
| JP | 2005-039197 | 2/2005 |
| JP | 2006-019764 | 1/2006 |
| JP | 2006-066641 | 3/2006 |
| JP | 2006-128726 | 5/2006 |
| JP | 2006-128727 | 5/2006 |
| JP | 2006-332383 | 12/2006 |
| JP | 2007-035846 | 2/2007 |
| JP | 2007-095744 | 4/2007 |
| JP | 2007-095745 | 4/2007 |
| JP | 2007-165405 | 6/2007 |
| JP | 2008-511969 | 4/2008 |
| JP | 2011-023541 | 2/2011 |

OTHER PUBLICATIONS

Notice of Allowance dated Jun. 27, 2014 in U.S. Appl. No. 13/865,574.

N. Sawaki, et al., "Acceptor Level due to Carbon in a (1-101) AlGaN", AIP Conf. Proc., Apr. 10, 2007—vol. 893, Abstract.

G. Yanquin, et al., "Deep levels in high resistivity GaN detected by thermally stimulated luminescence and first-principles calculations", Journal of Physics D: Applied Physics, vol. 42, No. 15, Aug. 7, 2009, Abstract.

C. H. Seager, et al, "Role of carbon in GaN", American Institute of Physics, J. Appl. Phys. 92, 6553 (2002), pp. 6553-6560.

J. L. Lyons, et al., "Carbon impurities and the yellow luminescence in GaN", Appl. Phys. Lett. 97, 152108 (2010), pp. 152108-1-152108-3.

S. Fischer, et al., "On p-type doping in GaN-acceptor binding energies", Appl. Phys. Lett, vol. 67, No. 9, Aug. 28, 1995, pp. 1298-1300.

S.H. Cho, et al., "Photoluminescence of Undoped GaN Grown on c-Piane Al2O3 by Electron Cyclotron Resonance Molecular Beam Epitaxy", Jpn. J. Appl. Phys. vol. 34(1995) pp. L1575-L1578.

P Boguslawski, et al., "Amphoteric properties of substitutional carbon impurity in GaN and AlN", Appl. Phys. Lett., vol. 69, No. 2, Jul. 8, 1996, pp. 233-235.

Kouta Tateno, et al., "Carbon doping and etching effects of $CBr_4$ during metalorganic chemical vapor deposition of GaAs and AlAs", Journal of Crystal Growth 172, Aug. 10, 1996, pp. 5-12.

Kouta Tateno, et al., "Carbon and silicon doping in GaAs and AlAs grown on (3 1 1 )-oriented GaAs substrates by metalorganic chemical vapor deposition," Journal of Crystal Growth 181 (1997), pp. 33-40.

Yanning Gong, et al., "Quantitative study of carbon doping of GaAs grown by metalorganic vapor-phase epitaxy", Journal of Crystal Growth, 209 (2000), pp. 43-49.

Tetsuya Yamamoto, et al., "Effects of oxygen incorporation in p-type AlN crystals doped with carbon species", Physica B, 273-274 (1999), pp. 113-115.

H. Katayama-Yoshida, et al., "Codoping method for the fabrication of low-resistivity wide band-gap semiconductors in p-type GaN, p-type AlN and n-type diamond: prediction versus experiment", Journal of Physics: Condensed Matter 13 (2001), pp. 8901-8914.

H. Katayama-Yoshida, et al., "Ab initio materials design for transparent-conducting-oxide-based new-functional materials" Appl. Phys. A 89, (2007), pp. 19-27.

N. Sawaki, et al., "A local vibration mode in a carbon doped (1-1 01 )AlGaN", Proc of SPIE, vol. 8262, pp. 82620D-1-82620D-7.

T. Hikosaka, et al., "Optical and electrical properties of ( 1-101) GaN grown on a 7o off-axis (001) Si substrate", Applied Physics Letters, vol. 84, No. 23, Jun. 7, 2004, pp. 4717-4719.

Rob Armitage, et al., "Electrical and optical properties of carbon-doped GaN grown by MBE on MOCVD GaN templates using a $CCl_4$ dopant source", Lawrence Berkeley National Laboratory, Apr. 15, 2002.

D. J. As, et al., "Carbon doping of cubic GaN under gallium-rich growth conditions", phys. stat. sol. (c) 0, No. 7, (2003)), pp. 2537-2540.

D.J. As, et al., "Carbon doping of non-polar cubic GaN by $CBr_4$", Journal of Crystal Growth, 311 (2009), pp. 2039-2041.

D. S. Green et al., "Carbon doping of GaN with $CBr_4$ in radio-frequency plasma-assisted molecular beam epitaxy" Journal of Applied Physics, vol. 95, No. 12, pp. 8456-8462, Jun. 15, 2004.

C. R. Abernathy, et al., "$CCl_4$ doping of GaN grown by metalorganic molecular beam epitaxy", Appl. Phys. Lett 66 (15), pp. 1969-1971, Apr. 10, 1995.

Norikatsu Koide, et al., "Incorporation of carbon on a ( 1 -101) facet of GaN by MOVPE", Journal of Crystal Growth 284 (2005) 341-346.

Hideo Kawanishi, et al., "Carbon-doped p-type (0001) plane AlGaN (Al=6-55%) with high hole density", Phys. Status Solidi B 249, No. 3, (2012), pp. 459-463.

Hideo Kawanish, "Carbon-doped p-type (0001) plane AlGaN (Al=0.06 to 0.55) with high hole density", Department of Electrical Engineering, Kogakuin University, Nakano-machi 2665-1, Hachioji-shi, Tokyo 192-0015, Japan.

H. Kawanishi, et al., "Achievement of High Hole-Density by Carbon-Doped (0001) Plane AlGaN Epitaxial Layer for Optical Device Applications", Kogakuin University, Nakano-machi 2665-1, Hachioji-shi, Tokyo 192-0015, Japan.

H. Kawanishi, et al., "Carbon-doped p-type (0001) plane AlGaN (Al=0.06 to 0.50) with high hole density", Dept. Electronics Engineering, Kogakuin University, Nakano-machi 2665-1, Hachioji-shi, Tokyo 192-0015, Japan.

Hideo Kawanishi, et al., "Carbon-doped high hole-density (0001) plane AlGaN epitaxial layer grown by LP Metal-Organic Vapor Phase Epitaxy", Kogakuin University, Nakano-machi 2665-1, Hachioji-shi, Tokyo 192-0015, Japan.

Hideo Kawanishi, et al., "Acceptor Energy Level of Carbon in p-Type AlGaN" Kogakuin University, Nakano-machi 2665-1, Hachioji-shi, Tokyo 192-0015, Japan.

P. Boguslawski, et al., "Doping properties of C, Si, and Ge impurities in GaN and AlN", Physical Review B vol. 56, No. 15, pp. 9496-9505, Oct. 15, 1997.

(56) References Cited

OTHER PUBLICATIONS

Yanqin Gai, et al., "Deep levels in high resistivity GaN detected by thermally stimulated luminescence and first-principles calculations", Journal of Physics D: Applied Physic vol. 42, No. 15, Aug. 7, 2009, Abstract.

* cited by examiner

Repeat multiple times

Fig.10

METHOD OF FABRICATING A P TYPE NITRIDE SEMICONDUCTOR LAYER DOPED WITH CARBON

CROSS-REFERENCE TO RELATED APPLICATION

This application is based upon and claims the benefit of priority from the prior Japanese Patent Application No. 2013-27026, filed on Feb. 14, 2013 and the prior Japanese Patent Application No. 2014-003759, filed on Jan. 10, 2014; the entire contents of which is incorporated herein by reference.

FIELD

The present invention is related to a semiconductor device and a method of manufacturing the semiconductor device, and in particular, to a method of manufacturing a nitride semiconductor layer doped with carbon, a p type nitride semiconductor layer manufactured by the method, and a device including the p type nitride semiconductor layer.

BACKGROUND

The control of electrical conductivity in p type AlGaN is a very difficult problem from technical and scientific viewpoints. Magnesium (Mg) is a main p type dopant for GaN and AlGaN. However, the acceptor level of Mg is about 230 mV (experimental value) in GaN and is even higher and deeper in AlGaN. As a result, the hole density of AlGaN doped with Mg becomes extremely low as compared to that of GaN also doped with Mg.

AlGaN doped with Mg (Mg-doped AlGaN) with a high aluminum composition rate is not suited to light emitting devices such as light emitting diodes (LEDs) or laser diodes because the electrical conductivity of Mg-doped AlGaN is very low. Therefore, light emitting devices such as LEDs or laser diodes using Mg-doped AlGaN with a high aluminum composition rate are very difficult to realize. Similar problems exist in the fabrication of ultrahigh high frequency or power control devices using a GaN or AlGaN nitride semiconductor.

For example, the acceptor level of magnesium (Mg) deepens as the aluminum composition rate in Mg-doped AlGaN increases. Consequently, the electrical activity of Mg drops to 1% or less as the aluminum composition rate increases, and then, the hole density of Mg-doped AlGaN becomes extremely low and the electrical resistivity thereof becomes high. In order to increase the hole density and decrease the electrical resistivity of AlGaN with a high Al composition rate, a large amount of Mg is added. However, when the concentration of added Mg is about $2\times10^{20}$ cm$^{-3}$ or higher, Mg causes segregation in AlGaN and then the crystalline quality drops significantly. Therefore, $2\times10^{20}$ cm$^{-3}$ or more of Mg cannot be doped into AlGaN. As a result, realization of ultra-violet LEDs, laser diodes, and electronic power control devices using Mg-doped AlGaN with a high Al composition rate becomes difficult.

In addition, when an AlGaN semiconductor layer is doped with Mg by the current Mg doping technology, the resultant AlGaN semiconductor layer has a low hole density and therefore has high resistivity. In the current LED structure, the layer thickness of a p type AlGaN layer can merely be increased to 0.1 μm to 0.2 μm at the maximum. In practice, it is difficult to increase the thickness of a p type AlGaN layer to 0.2 μm. In the meantime, an ultraviolet or deep-ultraviolet semiconductor laser using AlGaN with a high Al composition rate has not been realized. Consequently, the oscillating wavelength of the semiconductor laser is limited to a wavelength on the long wavelength side near the bandgap of GaN.

In addition, Mg is thermally diffused significantly. Even an attempt to form an n type layer on an Mg-doped p type layer fails because Mg thermally diffuses along defects. Therefore, npn or pnp bipolar transistors using an Mg dopant cannot be manufactured. This presents a serious obstacle against realization of electric power control devices for electric vehicles or hybrid vehicles.

As described above, there are various problems related to an Mg-doped p type AlGaN layer. For solving these problems, patent document 1 (Japanese Laid Open Patent Publication 2011-23541) discloses the following technology. A support body is used which is formed of a III-group nitride semiconductor and has a main surface having an angle of 40° or more and 140° or less with respect to a reference plane which perpendicularly intersects a reference axis extending in a c axis direction. On the main surface of the support body, a p type gallium nitride semiconductor layer containing carbon at a concentration of $2\times10^{16}$ cm$^{-3}$ or higher in addition to Mg is formed.

Carbon is an amphoteric dopant, and thus becomes either an acceptor or a donor depending on the material into which carbon is introduced. In the method of manufacturing a p type gallium nitride semiconductor layer doped with Mg and carbon disclosed in patent document 1, the gallium nitride semiconductor layer may occasionally become of an n type, and it is not possible to form a p type gallium nitride semiconductor layer sufficiently stably. More specifically, because the main surface of the support body formed of a III-V group nitride semiconductor has an angle of 40° or more and 140° or less with respect to the reference plane which perpendicularly intersects the reference axis extending in the c axis direction, the carbon does not function as a p type dopant stably.

The present invention made in light of the above-described situation has an object of providing a method of manufacturing a semiconductor device including a p type gallium nitride semiconductor layer doped with carbon which has a high level of reproducibility and an improved productivity. The present invention has another object of providing a p type gallium nitride semiconductor layer doped with carbon which has high electrical conductivity and low resistivity, and a semiconductor light emitting device including such a p type gallium nitride semiconductor layer. (In this specification, a layer doped with carbon or AlGaN doped with carbon will also be expressed as "carbon-doped layer" or "carbon-doped AlGaN".)

SUMMARY

The invention of claim 1 provides a III-V group nitride semiconductor layer growth method of growing, using MOVPE, a III-V group nitride semiconductor layer on a substrate directly or with a single or a plurality of intermediate layers being provided therebetween, the method comprising supplying a III-source gas and a V-source gas, which are sources of Al$_x$Ga$_{1-x}$N (0<x≤1), and a carbon source gas as a p type dopant to a reactor to alternately grow a layer of III-group atoms and a carbon-doped layer of V-group atoms; wherein the substrate is either a sapphire substrate, a silicon substrate, a silicon carbide substrate, a gallium nitride substrate or an aluminum nitride substrate; and the substrate has a main surface having an offset angle in a range of +/−0.1% with respect to a C-plane or a crystal plane equivalent to the C-plane.

The invention of claim 2 provides a III-V group nitride semiconductor layer growth method of growing, using MOVPE, a III-V group nitride semiconductor layer on a substrate directly or with a single or a plurality of intermediate layers being provided therebetween, the method comprising alternately performing a step of supplying a III-source gas, which is a source of $Al_xGa_{1-x}N$ ($0<x\leq1$), to a reactor for a certain time period and a step of supplying a V-source gas, which is a source of $Al_xGa_{1-x}N$ ($0<x\leq1$), to the reactor for a certain time period to alternately grow a layer of III-group atoms and a layer of V-group atoms; and supplying a carbon source gas as a p type dopant during the certain time period in which the V-source gas is supplied to introduce carbon into the layer of V-group atoms.

According to the invention of claim 3, in the invention of claim 2, an Mg source gas is supplied during the certain time period in which the III-source gas is supplied.

According to the invention of claim 4, in the invention of claim 2, the Mg source gas is supplied during the certain time period in which the III-source gas is supplied and during the certain period in which the V-source gas is supplied.

According to the invention of claim 5, in the invention of claim 2, an Mg source gas is supplied during the certain time period in which the V-source gas is supplied.

According to the invention of claim 6, in the invention of any one of claims 2 to 5, the substrate is either a sapphire substrate, a silicon substrate, a silicon carbide substrate, a gallium nitride substrate or an aluminum nitride substrate.

According to the invention of claim 7, in the invention of any one of claims 2 to 6, the substrate has a main surface having an offset angle in a range of +/−0.1% with respect to a C-plane or a crystal plane equivalent to the C-plane.

According to the invention of claim 8, in the invention of any one of claims 1 to 7, the III-V group nitride semiconductor layer has a thickness of 0.1 μm or more.

The invention of claim 9 provides a III-V group nitride semiconductor layer growth method of growing a III-V group nitride semiconductor layer on a substrate directly or with a single or a plurality of intermediate layers being provided therebetween, the method comprising supplying a III-source gas and a V-source gas, which are sources of $Al_xGa_{1-x}N$ ($0<x\leq1$), to a reactor simultaneously; and supplying a carbon source gas as a p type dopant to the reactor together with the III-source gas and the V-source gas; wherein an amount ratio of V-source gas/III-source gas is 5 or higher and 600 or lower.

According to the invention of claim 10, in the invention of claim 9, the substrate is either a sapphire substrate, a silicon substrate, a silicon carbide substrate, a gallium nitride substrate or an aluminum nitride substrate; and the substrate has a main surface having an offset angle in a range of +/−0.1% with respect to a C-plane or a crystal plane equivalent to the C-plane.

An exemplary embodiment provides a nitride semiconductor light emitting device, comprising a stack of an n type nitride semiconductor layer, an active layer and a p type nitride semiconductor layer, wherein the p type nitride semiconductor layer includes a layer of III-group atoms and a carbon-doped layer of V-group atoms which are alternately grown on a substrate directly or with a single or a plurality of intermediate layers being provided therebetween; the layer of III-group atoms and the carbon-doped layer of V-group atoms are provided as a result of alternately supplying a III-source gas and a V-source gas, which are sources of $Al_xGa_{1-x}N$ ($0<x\leq1$), and a carbon source gas as a p type dopant; and the substrate is either a sapphire substrate, a silicon substrate, a silicon carbide substrate, a gallium nitride substrate or an aluminum nitride substrate, and has a main surface having an offset angle in a range of +/−0.1% with respect to a C-plane or a crystal plane equivalent to the C-plane.

An exemplary embodiment provides a nitride semiconductor light emitting device, comprising a stack of an n type nitride semiconductor layer, an active layer and a p type nitride semiconductor layer, wherein the p type nitride semiconductor layer includes a layer of III-group atoms and a carbon-doped layer of V-group atoms which are alternately grown as a result of alternately supplying a III-source gas and a V-source gas to a reactor respectively for certain time periods; and the p type nitride semiconductor layer has carbon introduced thereinto as a result of supplying a carbon source gas during the certain time period in which the V-source gas is supplied.

According to an exemplary embodiment, the p type nitride semiconductor layer is formed of $Al_xGa_{1-x}N$ ($0<x\leq1$).

According to an exemplary embodiment, the nitride semiconductor light emitting device further comprises a p type electrode provided directly on the p type nitride semiconductor layer.

An exemplary embodiment provides a semiconductor laser, comprising a p type nitride semiconductor layer, wherein the p type nitride semiconductor layer is a III-V group nitride semiconductor layer grown, using MOVPE, on a substrate directly or with a single or a plurality of intermediate layers being provided therebetween; and the III-V group nitride semiconductor layer is formed as a result of alternately performing a step of supplying a III-source gas, which is a source of $Al_xGa_{1-x}N$, to a reactor for a certain time period and a step of supplying a V-source gas, which is a source of $Al_xGa_{1-x}N$, to the reactor for a certain time period to alternately grow a layer of III-group atoms and a layer of V-group atoms, and supplying a carbon source gas as a p type dopant during the certain time period in which the V-source gas is supplied to introduce carbon into the layer of V-group atoms.

According to an exemplary embodiment, the p type nitride semiconductor layer has a thickness of 0.2 μm or more.

According to an exemplary embodiment, the p type nitride semiconductor layer has a thickness which is at least 1 to 3 times an oscillating wavelength.

An exemplary embodiment provides a nitride semiconductor light emitting device, comprising a stack of an n type nitride semiconductor layer, an active layer and a p type nitride semiconductor layer, wherein the p type nitride semiconductor layer is formed of carbon-doped p type $Al_xGa_{1-x}N$ ($0<x\leq1$) and has a superlattice structure; the p type nitride semiconductor layer is provided on a substrate directly or with a single or a plurality of intermediate layers being provided therebetween; and the substrate is either a sapphire substrate, a silicon substrate, a silicon carbide substrate, a gallium nitride substrate or an aluminum nitride substrate, and has a main surface having an offset angle in a range of +/−0.1% with respect to a C-plane or a crystal plane equivalent to the C-plane.

According to an exemplary embodiment, the nitride semiconductor light emitting device further comprises a p type electrode provided directly on the p type nitride semiconductor layer.

In accordance with the method of the present invention, it is possible to provide a III-V group nitride semiconductor doped with carbon which stably has p type conductivity.

Also in accordance with the method of the present invention, a p type III-V group nitride semiconductor doped with carbon can be formed of $Al_xGa_{1-x}N$ (0.001≤x≤1), and the Al composition rate thereof can be increased up to 77%. As a result of this, it is possible to form a p type nitride semiconductor layer having a wide bandgap.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

FIG. 10 shows the measurement results of contact resistance, sheet resistance, resistivity, carrier mobility, sheet carrier density, and carrier density of carbon-doped $Al_xGa_{1-x}N$ (x=0.27) according to the present invention, which was grown while changing the Al composition rate, the flow rate of the carbon source and the layer thickness;

DESCRIPTION OF EMBODIMENTS

First Embodiment

Figure 1A:
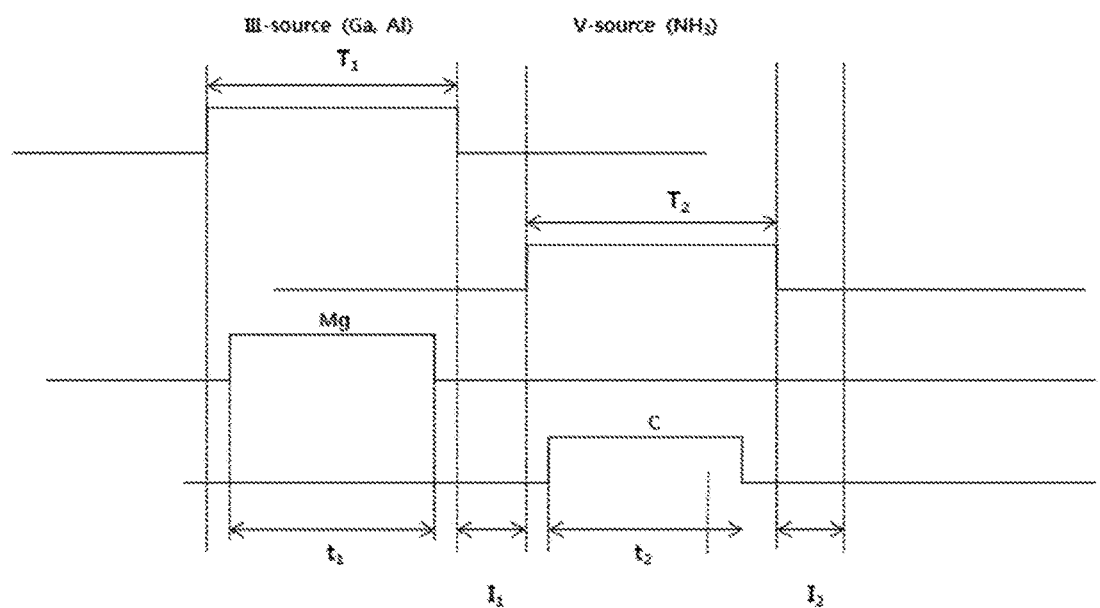
FIG. 1A shows one cycle of a gas supply method in a first example for epitaxially growing $Al_xGa_{1-x}N$, which uses an alternating supply method

Hereinafter, a method of manufacturing a III-V group nitride semiconductor doped with carbon as a p type dopant according to the present invention will be explained.

A III-V group nitride semiconductor layer doped with carbon as a p type dopant according to the present invention can be formed using a known deposition method which deposits a film on a substrate surface, such as metal organic chemical vapor deposition (MOCVD) or low pressure chemical vapor deposition (LPCVD).

In an embodiment of the present invention, an $Al_xGa_{1-x}N$ layer is manufactured as a III-V group nitride semiconductor layer by use of MOCVD (also referred to as "MOVPE (metal organic vapor phase epitaxy)").

First, a substrate on which $Al_xGa_{1-x}N$ is to be epitaxially grown is prepared. Any crystal plane substrate having a main surface which has an offset angle in a range of +/−0.1% with respect to a C-plane or a crystal plane equivalent to the C-plane is usable; therefore, the substrate is not limited to a sapphire substrate but may be any of various types of substrates including a silicon substrate, a silicon carbide substrate, a gallium nitride substrate and an aluminum nitride substrate. In the present specification, an "intermediate layer" refers to a layer grown on a substrate.

When the substrate has a main surface having an offset angle in a range of +/−0.1% with respect to a C-plane or a crystal plane equivalent to the C-plane, 5 to 7 molecular layers of III-group atoms and 5 to 7 molecular layers of V-group atoms can be deposited alternately on the substrate using a deposition method. More specifically, 5 to 7 molecular layers of III-group atoms, 5 to 7 molecular layers of V-group atoms, another 5 to 7 molecular layers of III-group atoms, another 5 to 7 molecular layers of V-group atoms, and the like are deposited.

As sources of a III-group element for growing $Al_xGa_{1-x}N$, trimethylgallium (TMG) and triethylaluminum (TMA; $(CH_3)_3Al$), for example, are used. As a source of Mg, cyclopentadienyl magnesium ($Cp_2Mg$), for example, is used. As a source of a V-group element for growing $Al_xGa_{1-x}N$, ammonia ($NH_3$), for example, is used. A carrier gas for transporting the sources may be, for example, hydrogen ($H_2$). It should be noted that these materials are merely examples and the present invention is not limited to using these materials.

Materials usable as a source of a carbon (C) dopant (hereinafter, referred to as a "carbon source") include, for example, carbon tetrabromide ($CBr_4$). In the present invention, the carbon source is not limited to carbon tetrabromide ($CBr_4$). However, it is not preferred to use acetylene as a carbon source because it has high reactivity and is dangerous. It is not preferred, either, to use carbon tetrachloride as a carbon source because it has etching effects, and when the flow rate thereof is too high, the crystal growth rate decreases significantly and a semiconductor layer no longer grows. Carbon tetrabromide is a halide like carbon tetrachloride and also has etching effects but is preferably used as a carbon source because bromine has a greater atomic number than that of chlorine, and therefore a chemical reaction thereof occurs slightly more slowly than that of carbon tetrachloride.

The conditions for growing $Al_xGa_{1-x}N$ using MOVPE are as follows, for example:

Growth temperature: 1180° C. or higher and 1370° C. or lower

Substrate surface temperature: 1070° C. or higher and 1250° C. or lower

Source gas pressure during growth: 4000 Pa or higher and 20000 Pa or lower

Amount ratio of V-group element source/III-group element source: 5 or higher and 600 or lower Supply amount of $CBr_4$: $7 \times 10^{-8}$ mol/min or more and $1.7 \times 10^{-5}$ mol/min or less Supply amount of $Cp_2Mg$: $1.3 \times 10^{-7}$ mol/min to $1.6 \times 10^{-7}$ mol/min Supply amount of source gas of III-group element (TMG and TMAl): $5 \times 10^{-5}$ mol/min The above-described growth conditions are examples only, and any other conditions are usable as long as $Al_xGa_{1-x}N$ is grown using MOVPE. It should be noted that the dissociation rate of nitrogen atoms from ammonia gas molecules depends highly on the temperature. In the case where ammonia gas is used as a component of a source gas of a V-group element, the dissociation rate of nitrogen atoms from ammonia gas molecules is closely related to the growth temperature of a p type AlGaN semiconductor layer. Therefore, it is preferred that a source gas of a III-group element (hereinafter, referred to as a "III-source gas") and a source gas of a V-group element (hereinafter, referred to as a "V-source gas") are supplied under the conditions that the growth temperature is in a range of 1180° C. or higher and 1370° C. or lower and the substrate temperature is in a range of 1070° C. or higher and 1250° C. or lower.

When the growth temperature is lower than 1180° C., it is difficult for carbon to enter the sites of nitrogen atoms within the AlGaN crystal. Therefore, it is preferred that the growth temperature is 1180° C. or higher. By contrast, when the growth temperature is higher than 1370° C., gallium atoms vaporize. Therefore, it is preferred that the growth temperature is 1370° C. or lower.

It is preferred that the optimal growth temperature of the AlGaN semiconductor layer to be formed is changed in accordance with the content (mol %) of aluminum in the AlGaN semiconductor layer. For example, in the case of AlGaN having an aluminum content of a few mol percent to 25 mol %, the optimal growth temperature is 1180° C. or higher and 1230° C. or lower. However, when the content (mol %) of aluminum in the AlGaN layer to be formed is higher, the growth temperature needs to be higher from the viewpoints of crystal quality and dopant characteristics. The optimal growth temperature in this case is 1180° C. or higher and 1370° C. or lower.

The amount ratio of V-group element source/III-group element source is set to a range of 5 or higher and 600 or lower because with the ratio in this range, carbon enters the sites of nitrogen atoms within the AlGaN crystal easily. With the ratio in this range, the amount of carbon which can be doped into the sites of nitrogen atoms within the AlGaN crystal can be maximized. When the growth temperature is 1250° C. or higher, an amount ratio of V-group element source/III-group element source of 5 or higher allows a sufficient amount of carbon to enter the sites of nitrogen atoms within the AlGaN crystal. By contrast, when the growth temperature is lower than 1250° C., it is preferred that the amount ratio of V-group element source/III-group element source is 200 or higher and 600 or lower.

Carbon tetrabromide, which is a carbon source, is preferably supplied to a reactor as follows. Carbon tetrabromide is dissolved in a solvent having a low vapor pressure and accommodated in a bubbler. A carrier gas is bubbled to supply the resultant carbon tetrabromide to the reactor. This method is preferable because it allows the carbon source to be supplied to the reactor stably and thus is suitable to a method of forming a p type semiconductor by putting carbon into the sites of nitrogen atoms within the AlGaN crystal.

Hereinafter, specific methods of supplying a gas usable in the method of manufacturing a III-V group nitrogen semiconductor layer doped with carbon as a p type dopant according to the present invention will be explained with reference to FIG. 1A through FIG. 3 and FIG. 6.

As methods of supplying gas for growing a III-V group nitrogen semiconductor layer using MOVPE, a simultaneous supply method of supplying a III-source gas and a V-source gas simultaneously, and an alternating supply method of supplying a III-source gas and a V-source gas alternately, are available. FIG. 1A shows one cycle of a gas supply method in a first example for epitaxially growing $Al_xGa_{1-x}N$. In the first example, the alternating supply method is used.

As is shown in FIG. 1A, a reactor is charged with trimethylgallium (TMG) and triethylaluminum (TMA; $(CH_3)_3Al$), which are respectively sources of Ga and Al as III-group elements, for a time period $T_1$. Cyclopentadienyl magnesium ($Cp_2Mg$), which is a source of Mg, is supplied to the reactor for a time period $t_1$, which overlaps and is shorter than the time period $T_1$.

After the time period $T_1$ elapses and then an interval time period $I_1$ elapses, ammonia ($NH_3$), which is a source of N as a V-group element, is supplied to the reactor for a time period $T_2$. Carbon tetrabromide ($CBr_4$), which is a carbon source, is supplied to the reactor for a time period $t_2$, which overlaps and is shorter than the time period $T_2$.

After the time period $T_2$ elapses and then an interval time period $I_2$ elapses, the III-group element source is supplied for the time period $T_1$ and the Mg source is supplied for the time period $t_1$. Then, after the interval time period $I_1$ elapses, the V-group element source is supplied for the time period $T_2$, and the carbon source is supplied for the time period $t_2$. This cycle is repeated multiple times. In this way, $Al_xGa_{1-x}N$ is grown to a desired film thickness.

The interval time period $I_1$ and the interval time period $I_2$ are each 2 seconds at the maximum. The interval time period $I_1$ and the interval time period $I_2$ may be 0 seconds. However, with neither the interval time period $I_1$ nor $I_2$, there is a possibility that the III-source gas mixes with the V-source gas. Therefore, it is preferable to provide the interval time periods $I_1$ and $I_2$. By contrast, when the interval time periods $I_1$ and $I_2$ are set to be longer than 2 seconds, the crystal quality at the interface of the grown film may degrade significantly due to re-evaporation of the components in the grown film from the interface, or adsorption or incorporation of a residual gas. Therefore, it is not preferred to set each of the interval time periods $I_1$ and $I_2$ to be longer than 2 seconds.

Under the growth conditions by MOVPE described above, the AlGaN semiconductor layer grown by the gas supply method in the first example stably has p type conductivity. A reason for this is that since a substrate having a main surface which has an offset angle in a range of +/−0.1% with respect to a C-plane or a crystal plane equivalent to the C-plane is used, as shown in FIG. 1B, 5 to 7 molecular layers of III-group atoms are grown at 102 and 5 to 7 molecular layers of V-group atoms are grown at 104. The process is repeated a number of times so that they are alternately stacked on the substrate and thus carbon securely enters the V-group atom layers.

Figure 1B:
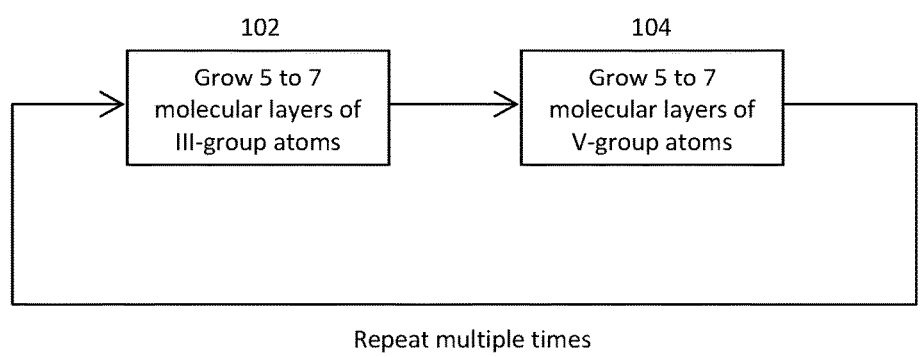
FIG. 1B illustrates the alternate growth of 5 to 7 molecular layers of III-group atoms and 5 & 7 molecular layers of V-group atoms.

Carbon, when entering a III-group atom layer, becomes an n type dopant, and when entering a V-group atom layer, becomes a p type dopant. According to the growth method of the present invention, as shown in FIG. 1B, about 5 to 7 molecular layers of III-group atoms are grown at 102 and about 5 to 7 molecular layers of V-group atoms are grown at 104, are alternately stacked on the substrate, and carbon enters the V-group atom layers. Therefore, according to the method of the present invention, a p type AlGaN semiconductor layer can be formed stably.

Figure 2:
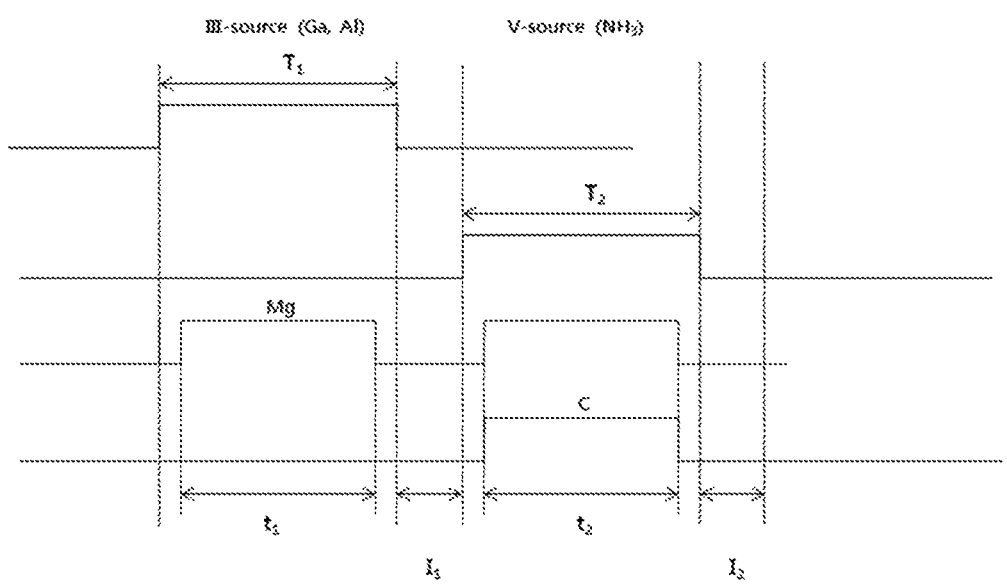
FIG. 2 shows one cycle of a gas supply method in a second example for epitaxially growing $Al_xGa_{1-x}N$, which uses the alternating supply method.

FIG. 2 shows one cycle of a gas supply method in a second example for epitaxially growing $Al_xGa_{1-x}N$. In the second example, the alternating supply method is used.

In the first example, cyclopentadienyl magnesium ($Cp_2Mg$) is supplied for the time period $t_1$, which overlaps and is shorter than the time period $T_1$. By contrast, in the second example, cyclopentadienyl magnesium ($Cp_2Mg$) is supplied for the time period $t_2$, in which carbon tetrabromide ($CBr_4$) as a carbon source is supplied. The other steps in the second example are substantially the same as those in the first example.

Figure 3:
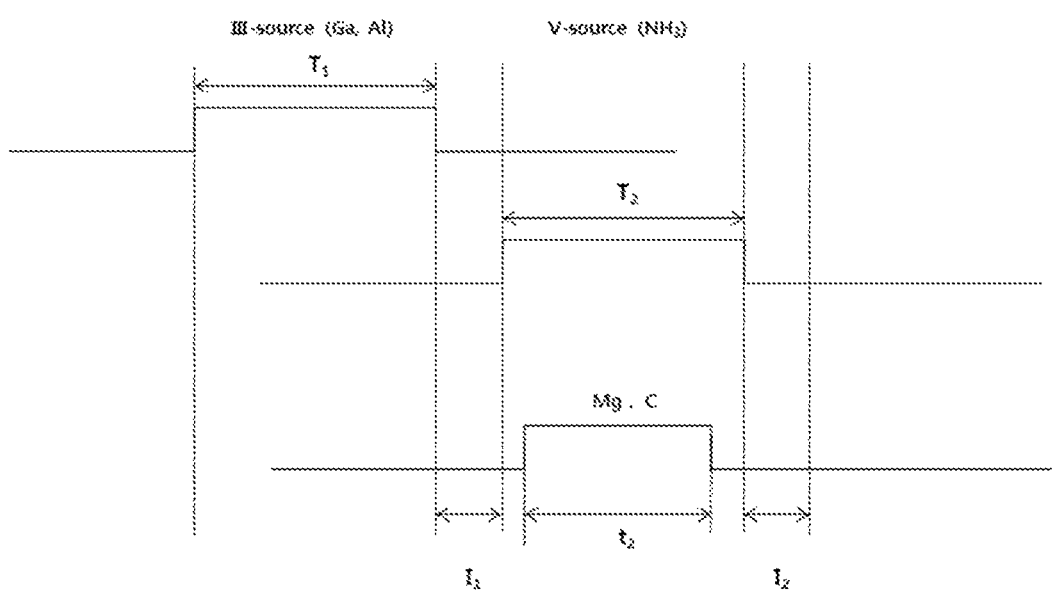
FIG. 3 shows one cycle of a gas supply method in a third example for epitaxially growing $Al_xGa_{1-x}N$, which uses the alternating supply method.

FIG. 3 shows one cycle of a gas supply method in a third example for epitaxially growing $Al_xGa_{1-x}N$. In the third example, the alternating supply method is used.

In the third example, unlike in the first and second examples, cyclopentadienyl magnesium ($Cp_2Mg$) is supplied to the reactor for the time period $t_1$ and the time period $t_2$. The other steps in the third example are substantially the same as those in the first and second examples.

An Mg source gas, even if being supplied to the reactor continuously, does not cause any particular problem in the process of growing the AlGaN semiconductor layer. Since the Mg source gas can be supplied continuously, no precise control on the timing to supply the Mg source gas is necessary. This can simplify the manufacturing process.

Figure 4:
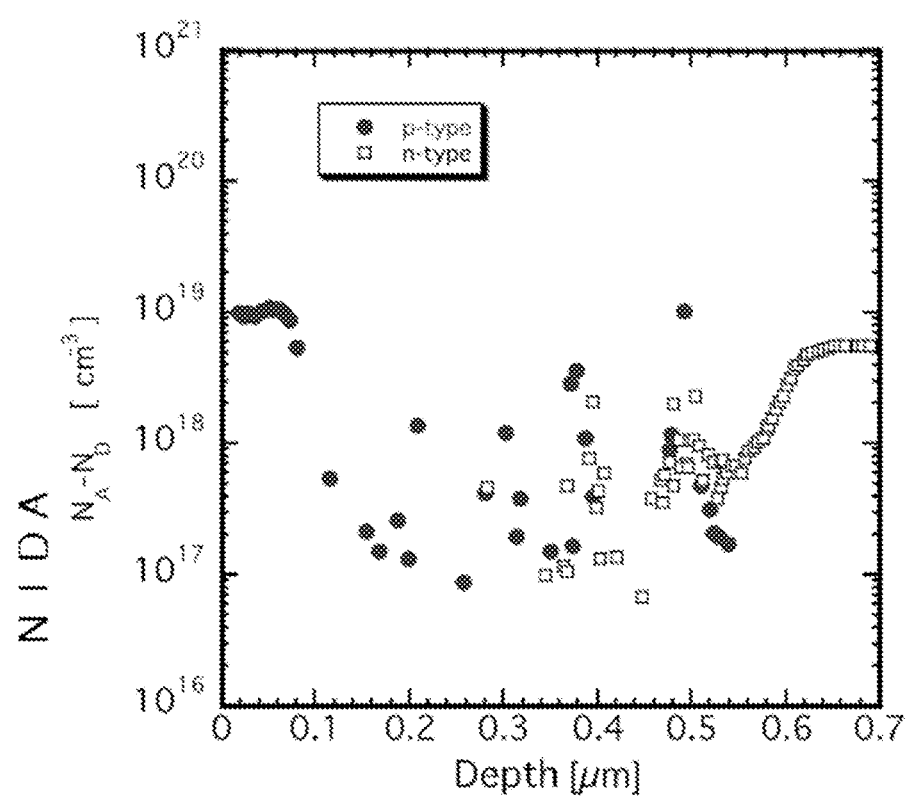
FIG. 4 shows an ionized acceptor concentration of an $Al_xGa_{1-x}N$ (x=0.55) semiconductor layer, which is grown by the gas supply method in the first example, in a film depth direction which is measured by a C-V measurement method (ionized dopant concentration measurement)

FIG. 4 shows an ionized acceptor concentration of an $Al_xGa_{1-x}N$ (x=0.55) semiconductor layer in a film depth direction which is measured by a C-V measurement method (ionized dopant concentration measurement). The $Al_xGa_{1-x}N$ semiconductor layer is grown by the gas supply method in the first example under the following growth conditions.

Growth temperature: 1180° C. or higher and 1230° C. or lower

Substrate surface temperature: 1070° C. or higher and 1110° C. or lower

Source gas pressure during growth: 4000 Pa or higher and 20000 Pa or lower

Amount ratio of V-group element source/III-group element source: 5 or higher and 600 or lower Supply amount of $CBr_4$: $7 \times 10^{-8}$ mol/min or more and $1.7 \times 10^{-5}$ mol/min or less.

Supply amount of $Cp_2Mg$: $1.3 \times 10^{-7}$ mol/min to $1.6 \times 10^{-7}$ mol/min.

Supply amount of III-source gas (TMG and TMAl): $5 \times 10^{-5}$ mol/min.

The term "ionized dopant concentration" means the concentration of dopants, among the introduced dopants, which generate carriers and are negatively or positively ionized. The ionized dopants are not free carriers but ions fixed to the crystal. Thus, the C-V measurement method can accurately analyze the doping process without being influenced by an internal electrical field of the crystal. The device used in this measurement is ECV-Pro manufactured by Nanometrics.

FIG. 4 shows that the area of the layer from the surface down to a level having a depth of 0.1 µm exhibits p type conductivity. However, some areas deeper than this level have n type ions and p type ions inverted and thus are unstable.

Figure 5:
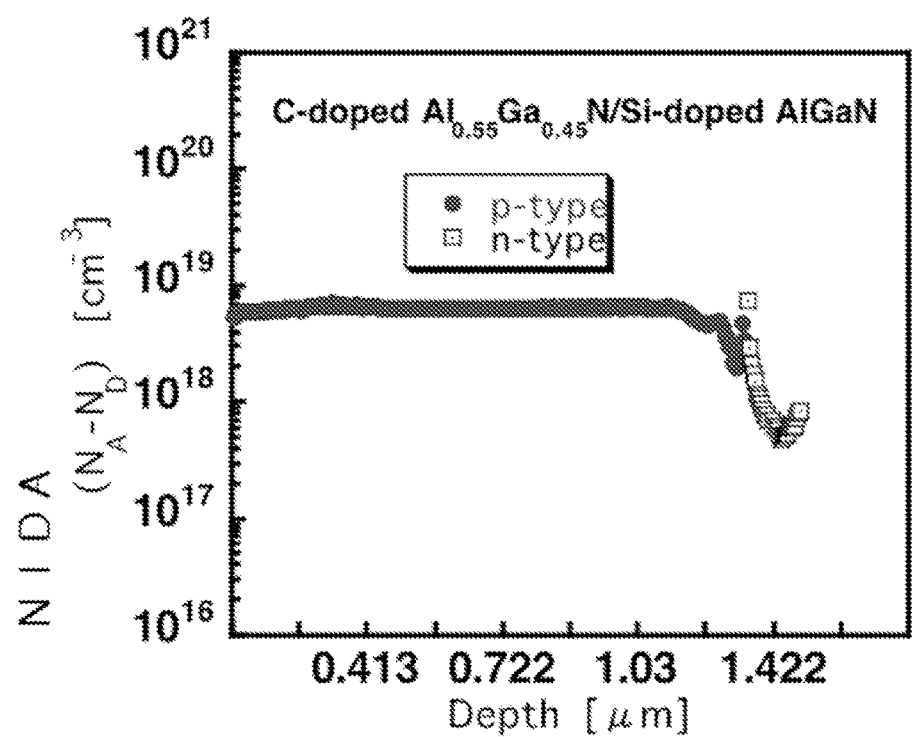
FIG. 5 shows an ionized acceptor concentration of an $Al_xGa_{1-x}N$ (x=0.55) semiconductor layer, which is grown by the gas supply method in the second example, in the film depth direction which is measured by the C-V measurement method (ionized dopant concentration measurement)

FIG. 5 shows an ionized acceptor concentration of an $Al_xGa_{1-x}N$ (x=0.55) semiconductor layer in the film depth direction which is measured by the C-V measurement method (ionized dopant concentration measurement). The $Al_xGa_{1-x}N$ semiconductor layer is grown by the gas supply method in the second example under the same growth conditions as above. FIG. 5 shows that the layer stably exhibits p type conductivity down to a level having a depth of 1.3 µm. This indicates that when an Mg source gas and a carbon source gas are supplied simultaneously along with a V-source gas, carbon enters the V-group atom layer more actively.

In the second example, the Mg source gas is supplied together with the carbon source gas. As is understood from the measurement results in FIG. 4 and FIG. 5, when a test is performed of growing an AlGaN semiconductor film by the gas supply method in the first example and an AlGaN semiconductor film by the gas supply method in the second example while the other conditions including the growth temperature and the like are the same, the AlGaN semiconductor film grown by the gas supply method in the second example exhibits a high ionized acceptor concentration more stably than the AlGaN semiconductor film grown by the gas supply method in the first example.

A reason why carbon enters the V-group atom layer more easily in the second example than in the first example is as follows. According to the second example, cyclopentadienyl magnesium ($Cp_2Mg$) is supplied together with the V-source gas, and thus Mg is doped into the V-group atom layer. Mg is considered to have an effect of introducing defects to the AlGaN crystal. As a result, when Mg is doped into the V-group atom layer at a much lower concentration than the carbon concentration, Mg can increase the number of defects within the AlGaN crystal to such a level that carbon can enter the V-group atom layer, without Mg damaging the hetero interface of the AlGaN crystal.

Like the gas supply method in the second example, the gas supply method in the third example allows an Mg source gas to be supplied together with a carbon source gas and thus provides substantially the same effect as that of the gas supply method in the second example.

Figure 6:
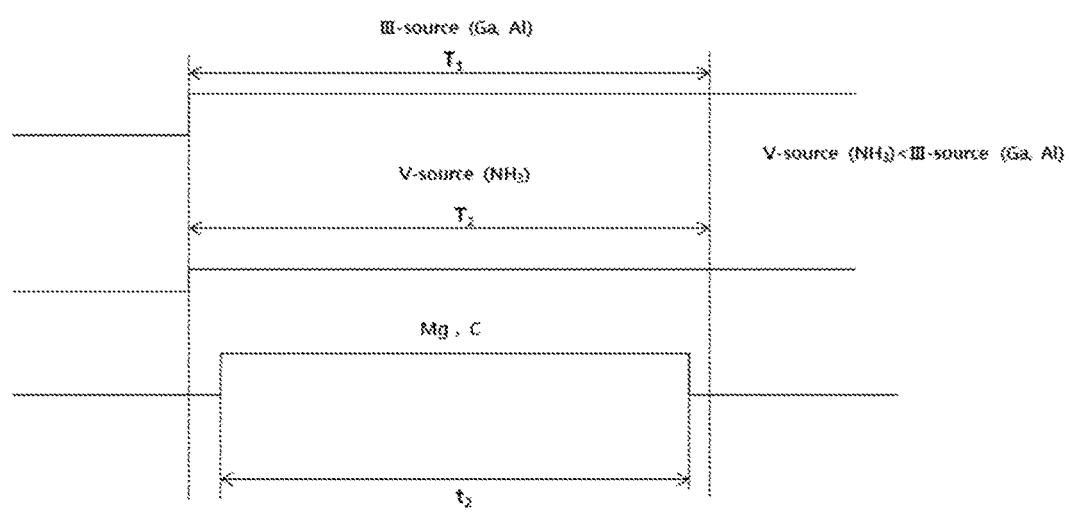
FIG. 6 shows one cycle of a gas supply method in a fourth example for epitaxially growing $Al_xGa_{1-x}N$, which uses a simultaneous supply method.

FIG. 6 shows one cycle of a gas supply method in a fourth example for epitaxially growing $Al_xGa_{1-x}N$. In the fourth example, the simultaneous supply method is used.

In the fourth example, trimethylgallium (TMG) and triethylaluminum (TMA; $(CH_3)_3Al$), which are respectively sources of Ga and Al as III-group elements, are supplied to a reactor for a time period $T_1$. Ammonia ($NH_3$), which is a source of N as a V-group element, is supplied to the reactor simultaneously in the same time period (time period $T_2$). Cyclopentadienyl magnesium ($Cp_2Mg$), which is a source of Mg, and carbon tetrabromide ($CBr_4$), which is a carbon source, are supplied to the reactor for a time period $t_2$, which overlaps and is shorter than the time periods $T_1$ and $T_2$. In this way, $Al_xGa_{1-x}N$ is grown to a desired film thickness.

In the fourth example, unlike in the case of the alternating supply method, it is preferred that the amount ratio of V-group element source/III-group element source is as low as possible within a range of 5 or higher and 600 or lower. Carbon enters the V-group atom layer more easily when the V-group atoms are supplied while being depleted as much as possible.

The gas supply methods in the plurality of examples have been explained above. In either the alternating supply method or the simultaneous supply method, when a substrate having a main surface which has an offset angle in a range of +/−0.1% with respect to a C-plane or a crystal plane equivalent to the C-plane is used, about 5 molecular layers of III-group atoms and about 5 molecular layers of V-group atoms are alternately stacked on the substrate and carbon enters the V-group atom layers. Therefore, as long as a substrate having a main surface which has an offset angle in the above-described range is used, a p type AlGaN semiconductor layer can be stably grown regardless of whether the alternating supply method is used or the simultaneous supply method is used.

However, in the case of the simultaneous supply method, V-group atoms need to be supplied while being depleted as much as possible as described above. Therefore, the simultaneous supply method requires strict control on the amount ratio of V-group element source/III-group element source. By contrast, in the case of the alternating supply method, the control on the amount ratio of V-group element source/III-group element source can be significantly relaxed, and carbon enters the V-group atom layers much more actively than in the simultaneous supply method.

Figure 7:
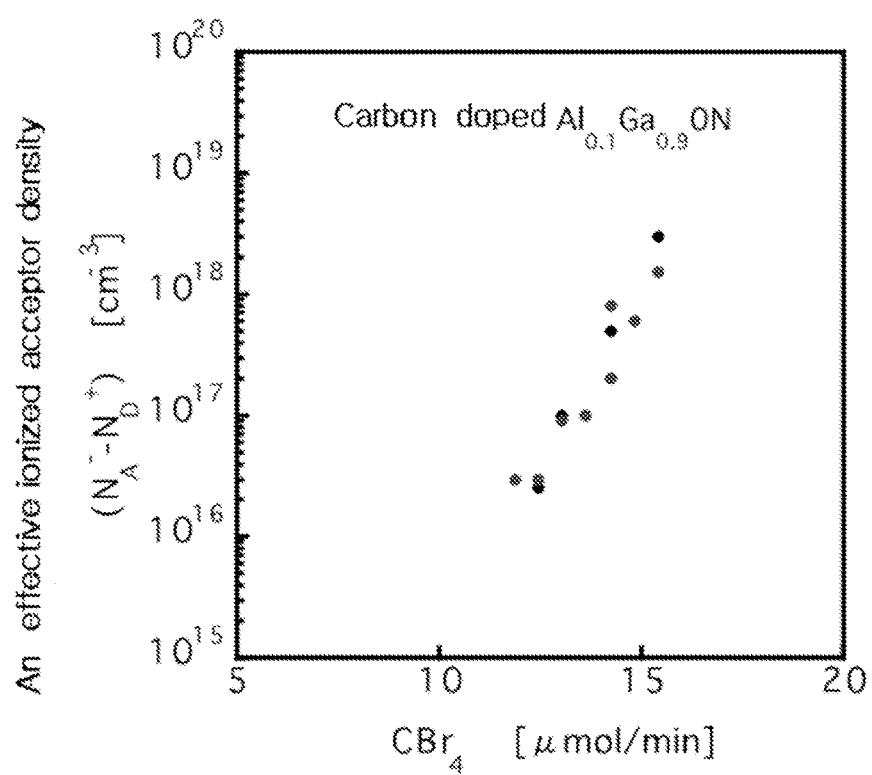
FIG. 7 shows the relationship between the flow rate of $CBr_4$, which is carbon source gas, and an effective ionized acceptor concentration of carbon-doped $Al_xGa_{1-x}N$ (x=0.1)

FIG. 7 shows the relationship between the flow rate of $CBr_4$, which is a carbon source gas, and an effective ionized acceptor concentration of carbon-doped $Al_xGa_{1-x}N$ (x=0.1). It can be understood from FIG. 7 that when the flow rate of $CBr_4$ exceeds at least 12 µmol/min, the effective ionized acceptor concentration reaches $10^{16}$ cm$^{-3}$; and after this, the effective ionized acceptor concentration increases in proportion to the flow rate of $CBr_4$.

Figure 8:
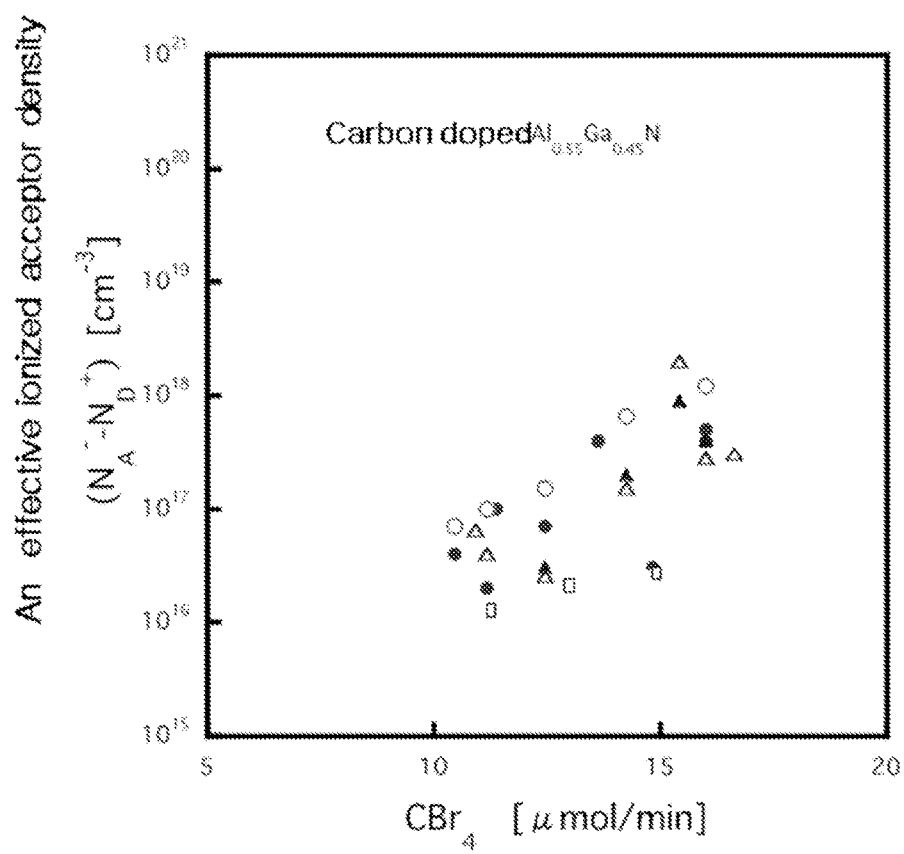
FIG. 8 shows the relationship between the flow rate of $CBr_4$, which is carbon source gas, and an effective ionized acceptor concentration of carbon-doped $Al_xGa_{1-x}N$ (x=0.55)

FIG. 8 shows the relationship between the flow rate of $CBr_4$, which is a carbon source gas, and an effective ionized acceptor concentration of carbon-doped $Al_xGa_{1-x}N$ (x=0.55). FIG. 8 shows the results of a test performed as follows. Five substrates were prepared, and a plurality of layers were grown on each substrate while changing the flow rate of $CBr_4$ for each layer. The effective ionized acceptor concentration was measured for each layer of each substrate. The marks ○, ●, ▲, △ and □ specify the substrates, and the identical marks indicate the layers grown on the same substrate with different flow rates of $CBr_4$. A plot of the identical marks indicates a change of the effective ionized acceptor concentration of the layers grown under the same growth conditions (offset angle of the main surface of the substrate, substrate surface temperature, source gas pressure during growth, etc.) apart from the flow rate of $CBr_4$.

As shown in FIG. 8, the effective ionized acceptor concentration increases generally in proportion to the flow rate of $CBr_4$ in any of the growth conditions. It is understood that the effective ionized acceptor concentration can be controlled by controlling the flow rate of $CBr_4$. In FIG. 8, like in the case of $Al_xGa_{1-x}N$ (x=0.1), when the flow rate of $CBr_4$ exceeds at least 11 µmol/min, the effective ionized acceptor concentration reaches $10^{16}$ cm$^{-3}$; and after this, the effective ionized acceptor concentration increases in proportion to the flow rate of $CBr_4$.

It can be understood from the test described above that even when the Al composition rate in $Al_xGa_{1-x}N$ is high, the effective ionized acceptor concentration can be adjusted by adjusting the flow rate of $CBr_4$.

Figure 9:
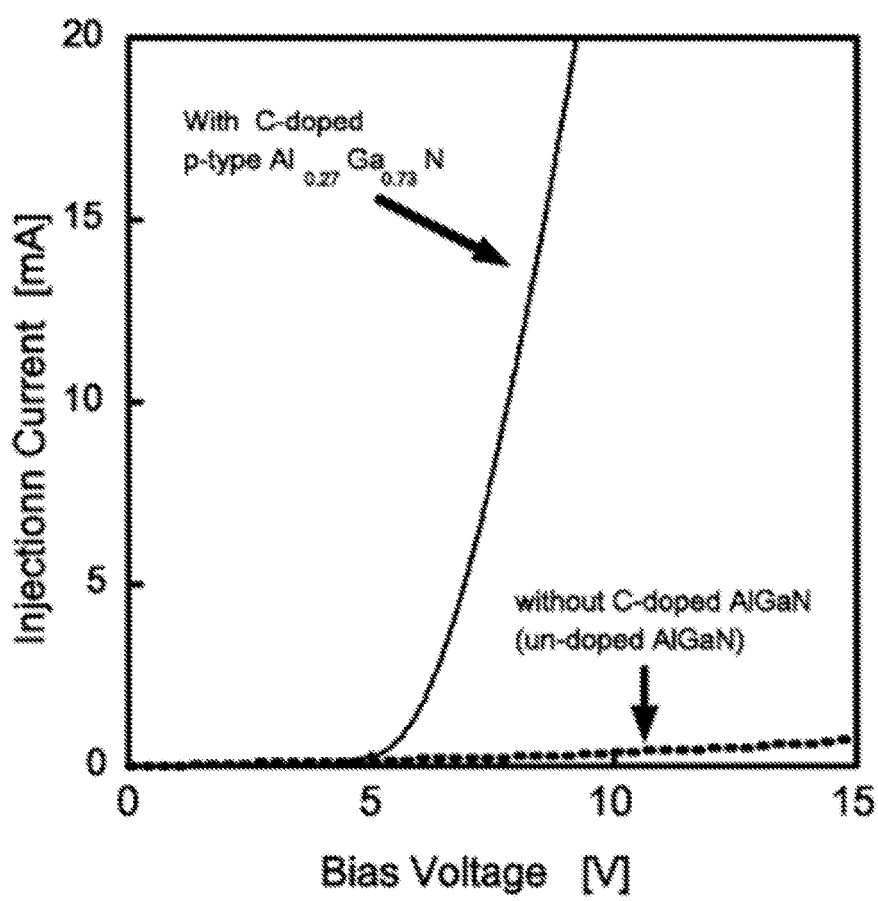
FIG. 9 shows the measurement results of the I-V characteristics of carbon-doped $Al_xGa_{1-x}N$ (x=0.27) according to the present invention and Mg-doped $Al_xGa_{1-x}N$ (x=0.27)

FIG. 9 shows the measurement results of the I-V characteristics of carbon-doped $Al_xGa_{1-x}N$ (x=0.27) according to the present invention and Mg-doped $Al_xGa_{1-x}N$ (x=0.27).

It can be understood from FIG. 9 that when a bias voltage of about 9V is applied to Mg-doped $Al_xGa_{1-x}N$ (x=0.27), an injection current of only about 1 mA flows; whereas when a bias voltage of about 9V is applied to carbon-doped $Al_xGa_{1-x}N$ (x=0.27) according to the present invention, an injection current of 20 mA flows.

These results demonstrate that carbon-doped $Al_xGa_{1-x}N$ (x=0.27) according to the present invention has significantly lower resistivity as compared to Mg-doped $Al_xGa_{1-x}N$ (x=0.27). Therefore, in the case where carbon-doped $Al_xGa_{1-x}N$ (x=0.27) according to the present invention is used for a p type cladding layer, a p type electrode can be stacked directly thereon without a contact layer being provided therebetween.

Figure 10:
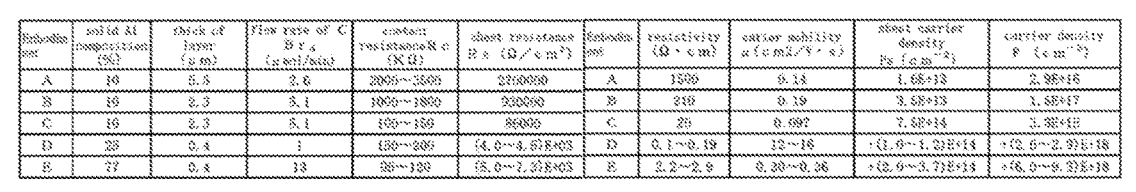

FIG. 10 shows the measurement results of contact resistance, sheet resistance, resistivity, carrier mobility, sheet carrier density, and carrier density of carbon-doped $Al_xGa_{1-x}N$ (x=0.27) according to the present invention, which was grown while changing the Al composition rate, the flow rate of the carbon source, and the and the layer thickness.

According to the manufacturing method of the present invention, the aluminum composition rate in carbon-doped $Al_xGa_{1-x}N$ was increased to as high as around 70% while the carrier density was raised to as high as (6.0 to 9.3)E+18/cm$^3$.

Second Embodiment

Figure 11:
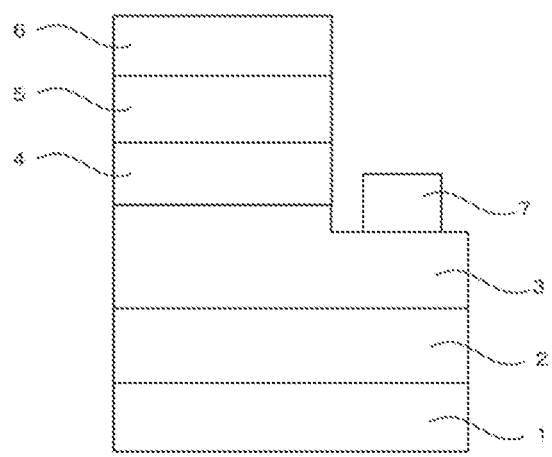
FIG. 11 is a conceptual view of an example of layer structure of a nitride semiconductor light emitting device using carbon-doped $Al_xGa_{1-x}N$ according to the present invention.

FIG. 11 is a conceptual view of a layer structure of a nitride semiconductor light emitting device using carbon-doped $Al_xGa_{1-x}N$ according to the present invention. In addition to the layers shown in FIG. 11, a cap layer, for example, may be formed, when necessary, between a light emitting layer (active layer) 4 and a p type nitride semiconductor layer 5, so that a dopant doped into the p type nitride semiconductor layer 5 does not diffuse into the light emitting layer 4.

Reference sign 1 refers to a substrate. The substrate 1 is a crystal plane substrate having a main surface which has an offset angle in a range of +/−0.1% with respect to a C-plane or a crystal plane equivalent to the C-plane. The substrate 1 may be any of various types of substrates including a sapphire substrate, a silicon substrate, a silicon carbide substrate, a gallium nitride substrate and an aluminum nitride substrate as long as being a crystal plane substrate having a main surface which has an offset angle in the above-described range.

Reference sign 2 refers to a buffer layer. The buffer layer 2 is provided for preventing defects from entering the crystal due to the difference between a lattice constant of the substrate 1 and a lattice constant of an n type nitride semiconductor layer 3 stacked on the substrate 1. The buffer layer 2 is formed of AlN or AlGaN, which has an intermediate lattice constant between those of the substrate 1 and the n type nitride semiconductor layer 3, so that the number of defects in the n type nitride semiconductor layer 3 is reduced. The buffer layer 2 may have a superlattice structure of AlN and AlGaN.

Reference sign 3 refers to the n type nitride semiconductor layer. The n type nitride semiconductor layer 3 may be formed of AlGaN, GaN, GaInN or the like. Although not shown in FIG. 11, the n type nitride semiconductor layer 3 may have a stack of an n type contact layer on which an n type electrode 7 is to be stacked and an n type cladding layer provided on the side of the light emitting layer 4. The n type contact layer may also act as the n type cladding layer. As an n type dopant, Si, Ge or the like is preferably usable.

In this example, the n type nitride semiconductor layer 3 includes the stack of the n type contact layer on which the n type electrode 7 is to be stacked and the n type cladding layer provided on the light emitting layer 4 side. The present invention is not limited to having such a structure. For example, the n type cladding layer provided on the light emitting layer 4 side, which is formed of an n type nitride semiconductor having a larger bandgap than that of the light emitting layer 4, may be replaced with an n type nitride semiconductor layer having the same bandgap as that of the light emitting layer 4.

Reference sign 4 refers to the light emitting layer. The light emitting layer 4 is formed of GaN, InGaN, AlGaN, AlGaInN or the like, and may have either a single quantum well (SQW) structure or a multiple quantum well (MQW) structure, in which well layers and barrier layers are repeatedly stacked. The wavelength of the light to be emitted is adjusted so as to be shifted to the short wavelength side when the Al composition rate in the well layer(s) is increased and shifted to the long wavelength side when the In composition rate in the well layer(s) is increased. The composition of the light emitting layer 4 is appropriately selected in accordance with the wavelength of the light to be emitted by the nitride semiconductor light emitting device.

Reference sign 5 refers to a p type nitride semiconductor layer. The p type nitride semiconductor layer 5 is formed of carbon-doped $Al_xGa_{1-x}N$ according to the present invention. According to the manufacturing method of the present invention, the composition rate of aluminum in $Al_xGa_{1-x}N$ can be increased up to 77%. When the aluminum composition rate is 77%, a p type cladding layer having a wider bandgap as compared to that of the light emitting layer 4 can be formed easily. It is ideal that the p type nitride semiconductor layer 5 has a thickness which is equal to, or larger than, the emission wavelength in order to provide a p type electrode 6 (described later) at a position sufficiently far from the active layer 4 so that there is no optical absorption loss. Specifically, the thickness of the p type nitride semiconductor layer 5 is 0.1 µm or more in consideration of the emission wavelength. In consideration of the bulk resistivity of the p type nitride semiconductor layer 5, the thickness thereof is preferably 0.1 µm or more and 4 µm or less.

The p type nitride semiconductor layer 5, which is formed of carbon-doped $Al_xGa_{1-x}N$ according to the present invention, has more excellent I-V characteristics as compared to those of a p type nitride semiconductor layer formed of Mg-doped p type GaN or AlGaN. Therefore, in the case where carbon-doped $Al_xGa_{1-x}N$ according to the present invention is used for the p type nitride semiconductor layer 5, the p type electrode 6 can be provided directly on the p type nitride semiconductor layer 5 without providing a current diffusion layer or a contact layer therebetween, although it is also possible to appropriately provide a current diffusion layer or a contact layer therebetween. The p type electrode 6 can be provided directly because the p type nitride semiconductor layer 5, which is formed of carbon-doped $Al_xGa_{1-x}N$ according to the present invention, causes a Schottky contact easily with the p type electrode 6 when the effective ionized acceptor concentration of the p type nitride semiconductor layer 5 is appropriately adjusted.

One of advantages of forming the p type electrode 6 directly on the p type nitride semiconductor layer 5 without forming a current diffusion layer or a contact layer is that ultraviolet light emitted from the light emitting layer 4 is output without being absorbed by the current diffusion layer or the contact layer. The current diffusion layer or the contact layer is usually provided for alleviating the contact resistance between the p type cladding layer and the p type electrode 6, and thus is formed of p type GaN doped with Mg at a high concentration (e.g., $(1-3)E+18/cm^3$). A p type GaN layer doped with Mg at such a high concentration has an advantage of alleviating the contact resistance but also has a property of absorbing ultraviolet light. For this reason, the semiconductor device including no current diffusion layer or contact layer has a more desirable structure as a light emitting device.

For realizing the Schottky contact between the p type nitride semiconductor layer 5 and the p type electrode 6, it is desirable to control the amount of carbon in the p type nitride semiconductor layer 5 so that the p type nitride semiconductor layer 5 has an effective ionized acceptor concentration of, for example, as high as $(8.0\ to\ 9.3)E+18/cm^3$. A reason for this is that when the effective ionized acceptor concentration is as high as $(8.0\ to\ 9.3)E+18/cm^3$, a depletion layer formed between the p type nitride semiconductor layer 5 and the p type electrode 6 provided thereon is narrowed, and as a result, a more ideal Schottky contact is realized.

The p type nitride semiconductor layer 5 may have a superlattice structure of carbon-doped $Al_xGa_{1-x}N$ according to the present invention. In this case, the resistivity of the p type nitride semiconductor layer 5 is decreased, for the following reason. When having a bulk structure, the p type nitride semiconductor layer 5 may possibly have high resistivity due to spontaneous polarization or an inner electric field such as a piezoelectric field or the like; whereas when having a superlattice structure, the p type nitride semiconductor layer 5 has the spontaneous polarization or the piezoelectric field weakened. Therefore, when the p type nitride semiconductor layer 5 has a superlattice structure of carbon-doped $Al_xGa_{1-x}N$, the Schottky barrier between the p type nitride semiconductor layer 5 and the p type electrode 6 can be lowered.

It is preferred that the superlattice structure of carbon-doped $Al_xGa_{1-x}N$ includes about 5 or more and about 10 or less pairs of a III-group atom layer and a V-group atom layer.

As described above, controlling the amount of carbon in the p type nitride semiconductor layer 5 to control the effective ionized acceptor concentration thereof, and forming the p type nitride semiconductor layer 5 of a superlattice structure, independently have an effect of decreasing the contact resistance between the p type nitride semiconductor layer 5 and the p type electrode 6. Moreover, when the p type nitride semiconductor layer 5 has a superlattice structure of $Al_xGa_{1-x}N$ having an improved effective ionized acceptor concentration as a result of control on the amount of carbon, the contact resistance between the p type nitride semiconductor layer 5 and the p type electrode 6 is further decreased by a combined effect. The nitride semiconductor light emitting device having such a structure has a higher light emitting efficiency.

Reference sign 6 refers to the p type electrode. The p type electrode 6 may be formed of a single film layer or a multiple film layer including 2 or more films which contains either Al, Pt, Ru, Ag, Ti, Au or Ni. The p type electrode 6 may be formed of an alloy containing at least two of these materials.

Reference sign 7 refers to the n type electrode. The n type electrode 7 is formed on an exposed surface of the n type nitride semiconductor layer 3 that is obtained as a result of etching the p type nitride semiconductor layer 5, the light emitting layer 4 and a part of the n type nitride semiconductor layer 3. The n type electrode 7 may be formed of a multiple film layer including 2 or more films of either Cr, Ti, Au, Al or Ni.

Third Embodiment

Figure 12:
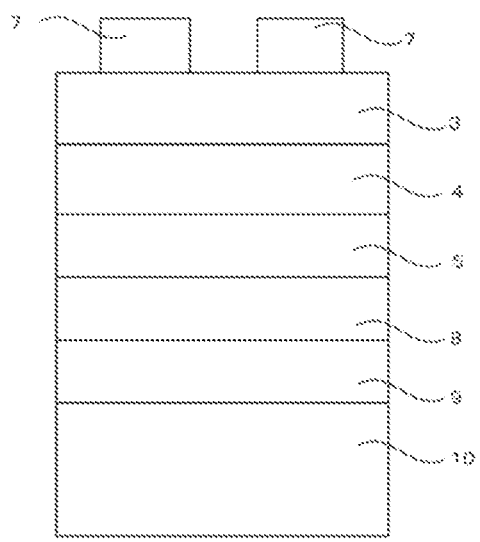
FIG. 12 is a conceptual view of another example of layer structure of a nitride semiconductor light emitting device using carbon-doped $Al_xGa_{1-x}N$ according to the present invention.

The layer structure of the nitride semiconductor light emitting device shown in FIG. 11 is merely an example. FIG. 12 shows an example of layer structure of a nitride semiconductor light emitting device which is different from that shown in FIG. 11. The same reference signs are used for parts substantially the same as, or equivalent to, the parts shown in FIG. 11.

The nitride semiconductor light emitting device shown in FIG. 12 is manufactured by the following method. A buffer layer 2 is stacked on a substrate 1, and an n type nitride semiconductor layer 3, a light emitting layer 4 and a p type nitride semiconductor layer 5 are sequentially stacked in this order thereupon. On the p type nitride semiconductor layer 5, a reflecting electrode 8 formed of a metal such as Ag or the like is formed. The reflecting electrode 8 is provided for reflecting light, among light emitted from the active layer 4, which is propagating in a direction opposite to a direction toward the light extracting surface of the active layer 4 in order to improve the light extraction efficiency. The reflecting electrode 8 functions also as a p type electrode. A layer formed of a composition which demonstrates a function of preventing the diffusion of the component of the reflecting electrode 8 may be provided between the reflecting electrode 8 and the p type nitride semiconductor layer 5.

The reflecting electrode 8 may be formed of Al because Al reflects light and thus improves the light extraction efficiency of the nitride semiconductor light emitting device.

A conductive substrate 10 formed of silicon or the like that is separately prepared is bonded onto the reflecting electrode 8 via an adhesive layer 9 formed of Au or the like. Following this, the substrate 1 is removed by polishing or etching. At this time, the entirety or a part of the buffer layer 2 may be removed together with the substrate 1 also by polishing or etching.

On the substrate 1 or a surface exposed as a result of the removal of the substrate 1 and the entirety or a part of the buffer layer 2, n type electrodes 7 are formed. The n type electrodes 7 may be transparent electrodes formed of ITO or the like.

So far, the nitride semiconductor light emitting device having the structure shown in FIG. 12 has been explained. In this example also, when carbon-doped $Al_xGa_{1-x}N$ according to the present invention is used for the p type nitride semiconductor layer 5, a p type cladding layer having a wider bandgap than that of the light emitting layer 4 is realized. Also in this example, a contact layer or the like, for causing an ohmic contact between the p type nitride semiconductor layer 5 and the reflecting electrode 8 provided thereon, does not need to be provided because the p type nitride semiconductor layer 5 has a low sheet resistance.

In the nitride semiconductor light emitting device having the structure shown in FIG. 12 also, controlling the amount of carbon doped into $Al_xGa_{1-x}N$ (p type nitride semiconductor layer 5) to control the effective ionized acceptor concentration thereof, and/or forming the p type nitride semiconductor layer 5 of a superlattice structure, independently have an effect of decreasing the contact resistance between the p type nitride semiconductor layer 5 and the p type electrode 8.

As explained above, according the present invention, stable manufacture of a carbon-doped p type nitride semiconductor layer, which has been difficult so far, is made possible. This will be described more specifically. Since a carbon-doped gallium nitride semiconductor layer may become of a p type or an n type because of the property of carbon, it has been difficult to stably manufacture a p type gallium nitride semiconductor layer using carbon doping. However, according to the present invention, the carbon-doped p type nitride semiconductor layer is manufactured stably.

In addition, since carbon is used as a dopant, the nitride semiconductor layer has low resistivity, unlike when Mg is used as a dopant. In the case where carbon-doped AlGaN is used for the gallium nitride semiconductor layer, a p type cladding layer with a larger bandgap than that of a light emitting layer formed of InGaN or the like is realized. Therefore, according to the present invention, a nitride semiconductor light emitting device with a high light emitting efficiency can be manufactured with no contact layer or the like being provided between the p type nitride semiconductor layer and the electrode.

In the p type nitride semiconductor layer formed of carbon-doped $Al_xGa_{1-x}N$ according to the present invention, a 20 mA current flows at a bias voltage of about 9V as is shown in FIG. 9. As can be seen from this, the p type nitride semiconductor layer formed of carbon-doped $Al_xGa_{1-x}N$ according to the present invention can have low resistivity when the effective ionized acceptor concentration thereof is appropriately controlled. Therefore, the p type nitride semiconductor layer formed of carbon-doped $Al_xGa_{1-x}N$ according to the present invention is applicable to a semiconductor laser in which the thickness of the p type nitride semiconductor layer needs to be 0.2 µm or more, preferably at least 1 to 3 times the oscillating wavelength (e.g., 0.5 µm or more when the wavelength is 250 nm) in order to locate the p type electrode far from the active layer, eliminate the optical absorption loss and thus reduce the oscillation threshold.

In other words, when a p type nitride semiconductor formed of carbon-doped $Al_xGa_{1-x}N$ having an effective ionized acceptor concentration controlled to, for example, (8.0 to 9.3)E+18/cm$^3$ is applied to a cladding layer of a semiconductor laser, the thickness of the cladding layer does not need to be minimized to a level that is about the same as the oscillating wavelength in order to decrease the device resistivity of the semiconductor laser. Specifically, the thickness of the cladding layer does not need to be as small as 0.1 µm as in the conventional art, but may be 0.2 µm or more. Preferably, the thickness of the cladding layer is at least 1 to 3 times the oscillating wavelength (e.g., 0.5 µm or more when the wavelength is 250 nm) as required in order to locate the p type electrode far from the active layer, eliminate the optical absorption loss and thus reduce the oscillation threshold.

This raises the degree of freedom in designing the structure of semiconductor lasers, and allows the active layer to have such a thickness as to minimize the oscillation threshold. As a result, a short wavelength semiconductor laser (for emitting light of a deep ultraviolet range of 300 nm or less), which has not been realized so far, can be manufactured. In addition, the operating life is significantly extended and the performance thereof is greatly improved.

An ultraviolet or deep-ultraviolet semiconductor laser is now strongly desired. A p type nitride semiconductor layer formed of carbon-doped $Al_xGa_{1-x}N$ according to the present invention is optimal for a cladding layer of such an ultraviolet semiconductor laser. Since the p type nitride semiconductor layer formed of carbon-doped $Al_xGa_{1-x}N$ according to the present invention allows a p type electrode to be provided thereon with no current diffusion layer or contact layer being provided therebetween, the ultraviolet light is output without being absorbed by the current diffusion layer or the contact layer. Thus, an ultraviolet semiconductor laser having a high light emitting efficiency is realized.

DESCRIPTION OF THE REFERENCE SIGNS

1 Substrate
2 Buffer layer
3 n Type nitride semiconductor layer
4 Light emitting layer 5 p Type nitride semiconductor layer
6 p Type electrode
7 n Type electrode

What is claimed is:

1. A method of growing, using metal organic vapor phase epitaxy (MOVPE), a uniform p type III-V group nitride semiconductor layer on a substrate directly or with a single or a plurality of intermediate layers being provided therebetween, the method comprising the steps of:
   (a) growing a layer consisting of 5 to 7 molecular layers of III-group atoms by supplying a III-source gas during a first time period;
   (b) growing a carbon-doped layer consisting of 5 to 7 molecular layers of V-group atoms by supplying a V-source gas during a second time period separate from the first time period and supplying a carbon source gas as a p type dopant during a time period that overlaps and is shorter than the second time period,
   alternately repeating the step of (a) and the step of (b), wherein:
   the substrate is either a sapphire substrate, a silicon substrate, a silicon carbide substrate, a gallium nitride substrate or an aluminum nitride substrate; and
   the substrate has a main surface having an offset angle in a range of +/−0.1% with respect to a C-plane or a crystal plane equivalent to the C-plane.

2. The uniform III-V group nitride semiconductor layer growth method according to claim 1, wherein the uniform III-V group nitride semiconductor layer has a thickness of 0.1 μm or more.

3. A method of growing, using metal organic vapor phase epitaxy (MOVPE), a uniform p type III-V group nitride semiconductor layer on a substrate directly or with a single or a plurality of intermediate layers being provided therebetween, the method comprising the steps of:
   (a) growing a layer consisting of 5 to 7 molecular layers of III-group atoms by supplying a III-source gas which is a source of $Al_xGa_{1-x}N$ (0<x≤1) during a first time period,
   (b) growing a carbon-doped layer consisting of 5 to 7 molecular layers of V-group atoms by supplying a V-source gas which is a source of $Al_xGa_{1-x}N$ (0<x≤1) during a second time period separate from the first time period, and
   alternately repeating the step of (a) and the step of (b),
   and further comprising supplying a carbon source gas as a p type dopant during a time period that overlaps with and is shorter than the second time period in which the V-source gas is supplied to introduce carbon into the layer of V-group atoms.

4. The uniform III-V group nitride semiconductor layer growth method according to claim 3, wherein an Mg source gas is supplied during the second time period in which the V-source gas is supplied.

5. The uniform III-V group nitride semiconductor layer growth method according to claim 3, wherein the Mg source gas is supplied during the first time period in which the III-source gas is supplied and during the second time period in which the V-source gas is supplied.

6. The uniform III-V group nitride semiconductor layer growth method according to claim 3, wherein an Mg source gas is supplied during the certain second time period in which the V-source gas is supplied.

7. The uniform III-V group nitride semiconductor layer growth method according to claim 3, wherein the substrate is either a sapphire substrate, a silicon substrate, a silicon carbide substrate, a gallium nitride substrate or an aluminum nitride substrate, and
the carbon source gas is carbon tetrabromide ($CBr_4$).

8. The uniform III-V group nitride semiconductor layer growth method according to claim 3, wherein the substrate has a main surface having an offset angle in a range of +/−0.1% with respect to a C-plane or a crystal plane equivalent to the C-plane.

9. A method of growing, using metal organic vapor phase epitaxy (MOVPE), a uniform p type III-V group nitride semiconductor layer on a substrate directly or with a single or a plurality of intermediate layers being provided therebetween, the method comprising the steps of:
   supplying a III-source gas and a V-source gas, which are sources of $Al_xGa_{1-x}N$ (0<x≤1) simultaneously, and
   supplying a carbon source gas as a p type dopant to the reactor together with the III-source gas and the V-source gas;
   wherein an amount ratio of V-source gas/III-source gas is 5 or higher and 600 or lower and the substrate has a main surface having an offset angle in a range of +/−0.1% with respect to a C-plane or a crystal plane equivalent to the C-plane.

10. The uniform III-V group nitride semiconductor layer growth method according to claim 9, wherein:
   the substrate is either a sapphire substrate, a silicon substrate, a silicon carbide substrate, a gallium nitride substrate or an aluminum nitride substrate; and
   the carbon source gas is carbon tetrabromide ($CBr_4$).

* * * * *